DRIFT COMPENSATING CIRCUITS

Filed Aug. 21, 1958 2 Sheets-Sheet 1

ROBERT M. MacINTYRE
INVENTOR.

BY

ATTORNEY

Dec. 25, 1962 R. M. MacINTYRE 3,070,786

DRIFT COMPENSATING CIRCUITS

Filed Aug. 21, 1958 2 Sheets-Sheet 2

ROBERT M. MacINTYRE
INVENTOR.

BY

[signature]
ATTORNEY

United States Patent Office 3,070,786

Patented Dec. 25, 1962

3,070,786

DRIFT COMPENSATING CIRCUITS

Robert M. MacIntyre, Gardena, Calif., assignor, by mesne assignments, to Thompson Ramo Wooldridge Inc., Cleveland, Ohio, a corporation of Ohio Filed Aug. 21, 1958, Ser. No. 756,374

8 Claims. (Cl. 340—347)

This invention relates to drift compensating circuits for direct current amplifiers and, more particularly, to an arrangement for minimizing the drift in an operational amplifier system which is time shared for amplifying a plurality of analog input signals.

Various techniques have been developed in the prior art to compensate for the drift inherent in the operation of D.C. amplifiers. According to the technique described in U.S. Patent No. 2,684,999 to Goldberg, drift voltage is sensed at the input circuit of the D.C. amplifier and is converted into an A.C. signal which is amplified and fed back as regeneration to the input circuit and thereby is effective to reduce the D.C. drift to a minimum.

The Goldberg circuit operates satisfactorily to compensate for amplifier drift where there is little or no current drawn by the input circuit of the D.C. amplifier. If current is drawn by the amplifier input circuit, as in the case of transistor amplifiers, an effective error input signal is present which is applied through an input impedance to the amplifier. The Goldberg circuit is not effective in this case since the error input appears to be another input signal. This means that arrangements of this prior art type do not compensate for the total drift error which results from an amplifier operation where input current is drawn.

The present invention provides an improved compensation circuit which operates essentially directly upon the D.C. amplifier output signal. This means that the invention is adapted to correct for the total drift, including that caused by current drawn by the amplifier. In its basic structural form, the invention comprises a compensating amplifier and switching means. The switching means functions to reference the input signal of the D.C. amplifier whose drift is to be compensated for to a known voltage, such as ground, and, at the same time, applies the output signal of the D.C. amplifier to the input of the compensating amplifier. When the D.C. amplifier senses an input signal, the switching means are operative then to apply a second reference signal, which may also be ground, to the input circuit of the compensating amplifier. In this manner the compensating amplifier sees an effective A.C. signal applied to its input which has a peak-to-peak amplitude equal to the drift error signal at the output of the D.C. amplifier. Means are also provided according to the invention to translate the amplified A.C. output signal of the compensating amplifier into an appropriate D.C. compensation signal which may be combined at the input circuit of the D.C. amplifier with the input signal in a manner effective to reduce the total drift.

While the invention may have a multitude of specific applications it is particularly useful in a commutating system wherein a plurality of input signals are to be applied through individual switches to the input of a D.C. amplifier. A typical example of this type of operation occurs in an analog-to-digital converter wherein a plurality of analog signals are applied through respective switches to a single time-shared D.C. amplifier. In this case the invention operates on a time-shared basis with the introduction of the analog input signals. That is, when an analog input signal is applied to the D.C. amplifier, the compensating amplifier receives a reference potential (may be ground) through an associated switch; whereas when no input signal is applied to the D.C. amplifier another reference potential (ground) is applied to its input circuit and the compensating amplifier then receives the error output signal of the D.C. amplifier.

In the above-mentioned specific application of the invention it may be noted that the D.C. amplifier may be the so-called operational amplifier or feedback amplifier. Thus the invention may be employed appropriately with a low-gain, closed-loop-configuration amplifier. In the case of the operational amplifier, the compensation signal produced by the compensating amplifier is readily combined at the input circuit of the D.C. amplifier through a well-known resistor adding circuit.

Accordingly, it is an object of the present invention to provide a compensating circuit for a D.C. amplifier which is adapted to reduce a total drift of the amplifier measured at its output circuit.

Another object of the invention is to provide an arrangement for compensating drift in a D.C. amplifier which may be operated on a time-sharing basis to permit the commutating of a plurality of input signals to the amplifier.

A further object of the invention is to provide a D.C. amplifier with drift compensation such that current drawn by the amplifier is compensated for through detecting the total error at the output circuit of the amplifier.

Still another object of the invention is to provide a compensating circuit suitable for use with low-gain, closed loop-configuration D.C. amplifiers.

A specific object of the invention is to provide a compensated D.C. amplifier system which is suitable for receiving a plurality of commutated analog input signals.

Another specific object of the invention is to provide a system for compensating for the output signal drift of a D.C. amplifier through the utilization of a plurality of simple switching circuits.

Yet another specific object of the invention is to provide a D.C. amplifier and drift compensation system which may be time-shared for amplifying a plurality of input signals, the system including means for applying reference signals to the compensating circuit of the D.C. amplifier during quiescent periods of the operation.

The novel features which are believed to be characteristic of the invention, both as to its organization and method of operation, together with further objects and advantages thereof will be better understood from the following description considered in connection with the accompanying drawings. It is to be expressly understood, however, that the drawings are for the purpose of illustration and description only, and are not intended as a definition of the limits of the invention.

Figure 2:
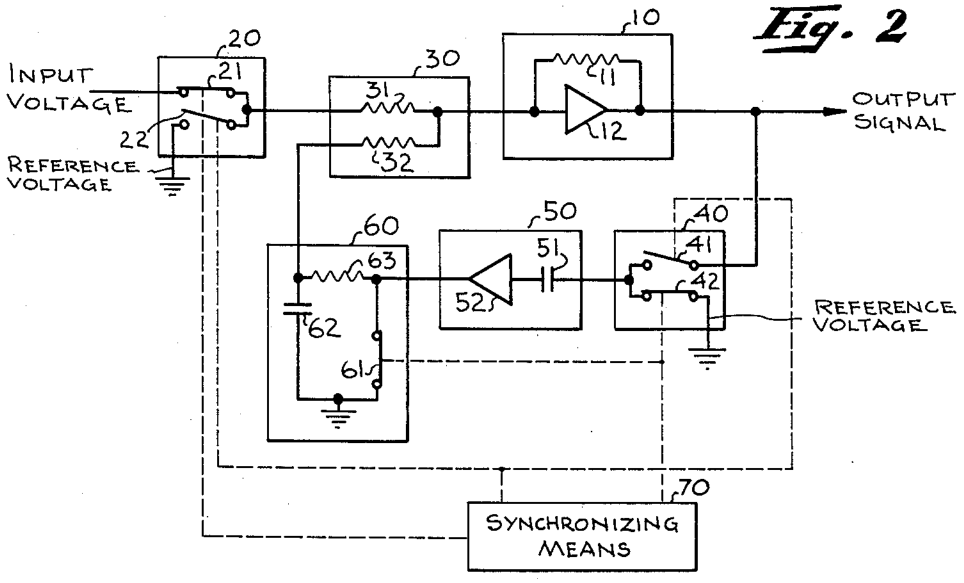
FIG. 2 is a schematic diagram corresponding to FIG. 1.
Figure 2A:
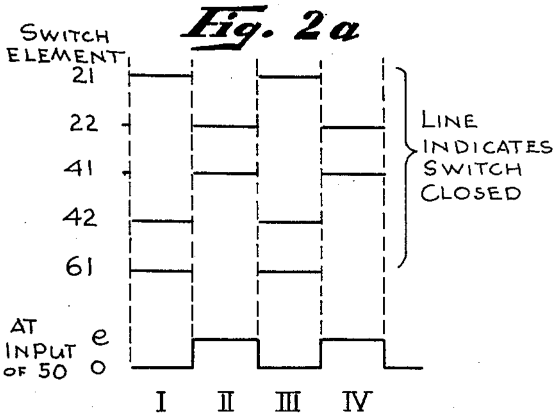
Figure 3:
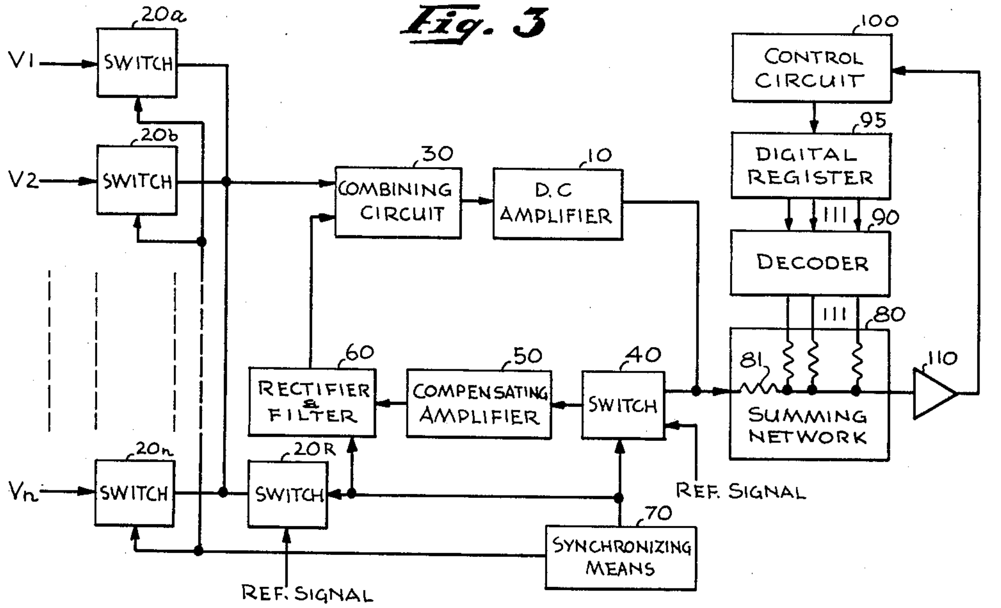
Figure 4:
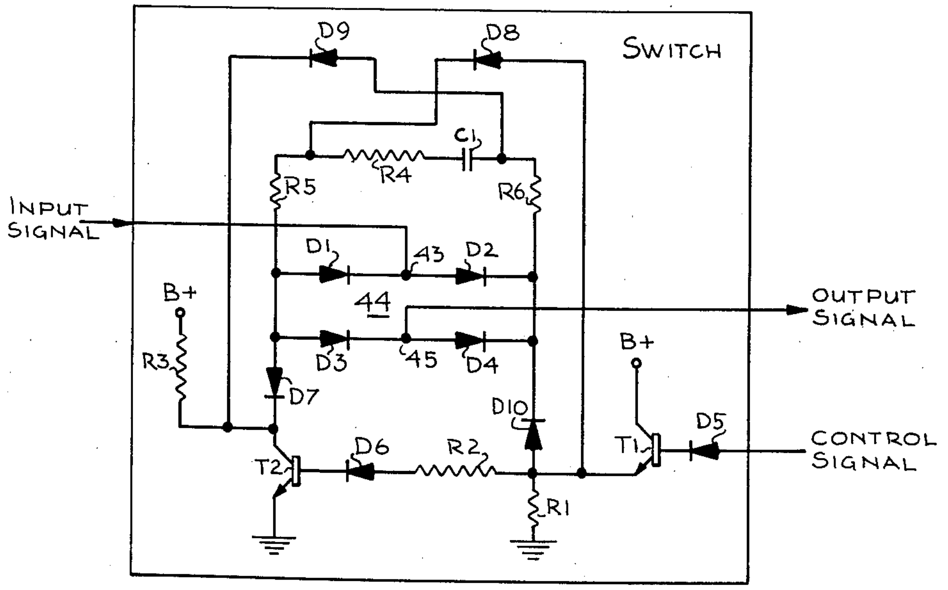

FIG. 2*a* is a composite set of timing diagrams illustrating the operation of the switches in the embodiment of FIG. 2;

FIG. 3 is a diagram of an analog-to-digital converter system employing the D.C. amplifier compensating circuit of the invention; and FIG. 4 is a schematic diagram of a suitable form of electronic switch which may be employed in the embodiments of the present invention.

Figure 1:
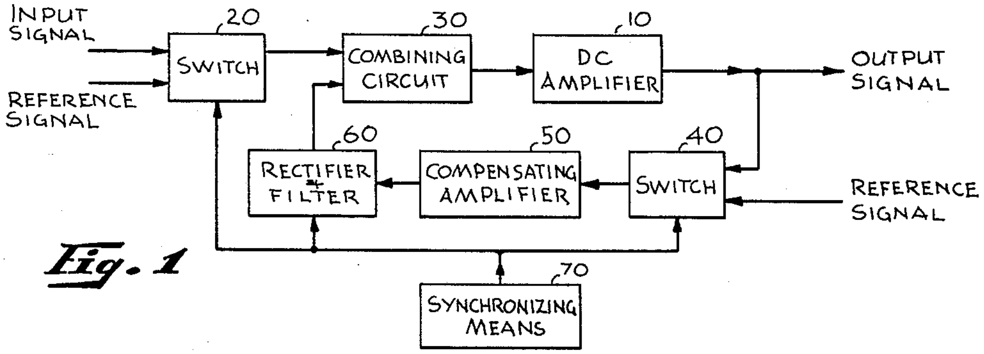
FIG. 1 is a block diagram illustrating the general form of one embodiment according to the present invention.

Reference is now made to FIG. 1 wherein a D.C. amplifier 10 is shown which produces an output signal having a drift component which will be referred to hereinafter as error signal "*e*." D.C. amplifier 10 receives an input signal through a switch 20 and a combining circuit 30. Switch 20 also receives a first reference signal which is applied to combining circuit 30 when no input signal is applied thereto. Thus D.C. amplifier 10 is operative to amplify the input signal when applied to switch 20 and combining circuit 30 during normal periods of operation and is effective to amplify the reference signal during other periods at which time the output signal is the drift signal "e."

The output signal of D.C. amplifier 10 is applied to a switch 40 which also receives a second reference signal. Switch 40 is coupled to compensating amplifier 50 for producing an output signal which is rectified and filtered in circuit 60 and is applied then to the combining circuit 30. The operation of all circuits is controlled by suitable synchronizing means 70, the essential function of which is to apply the first reference signal to combining circuit 30 at the same time that the output signal of D.C. amplifier 10 is applied to compensating amplifier 50 by switch 40, and to apply the input signal through switch 20 to combining circuit 30 at the same time the second reference signal is applied through switch 40 to compensating amplifier 50. In addition, synchronizing means 70 may also be operated to cause the operation of circuit 60 as a synchronous rectifier, as is hereinafter explained.

The specific as well as the general aspects of the invention can best be understood by considering the circuit of FIG. 2. Here, D.C. amplifier 10 is a well-known operational amplifier 12 with resistive feedback by means of resistor 11. Combining circuit 30 in this case is a resistor adder including a resistor 31 coupled to switch 20 and a resistor 32 coupled to circuit 60.

Switch 20 is shown as including two transfer elements, 21 and 22. These may constitute the elements of a relay or they may be considered to represent symbolically the switching action of an electronic switch, a suitable form of which is described below. Transfer element 21 is shown in the closed state whereas element 22 is open, illustrating the period of operation where the input signal is applied through switch 20 and combining circuit 30 to D.C. amplifier 10. At the same time switch 40 is shown with a transfer element 41 in the open state and a transfer element 42 in the closed state. This illustrates the fact that when the input signal is applied through switch 20 to amplifier 10, the second reference signal (ground) is applied through transfer element 42 to compensating amplifier 50.

The compensating amplifier 50 may be assumed, for the present example, to be a high-gain A.C. amplifier having a coupling capacitor 51 connected to an amplifier stage 52. The output signal of amplifier stage 52 is connected to a synchronous rectifier comprised of a switching element 61, a filter capacitor 62 and a resistor 63. Elements 61, 62 and 63 then constitute rectifier and filter circuit 60 shown in FIG. 1 and are operative to translate the A.C. compensating signal developed by circuit 40 into a corresponding D.C. signal which is then fed back in a negative sense to combining circuit 30 and is effective to reduce the drift which appears at the output circuit of amplifier 10.

The specific details are not shown for synchronizing means 70 since they may be conventional in all respects. For example, if the D.C. amplifier is employed as part of a digital computing system, the synchronizing means may constitute the counters and timing circuits which are normally present therein.

The operation of the embodiment of FIG. 2 is illustrated in FIG. 2*a*. In this figure four periods are shown referenced as I, II, III, and IV. Periods I and III are the normal operating periods at which time switch element 21 is closed and an input signal is applied to amplifier 10. In the case of FIG. 2*a* this input signal is assumed to be the same signal, reapplied. However, in a more complex system the input signal may be any one of a plurality of signals which are commutated through appropriate switches to amplifier 10 through combining circuit 20. This manner of operation is indicated as an illustration in FIG. 3 where an analog-to-digital converter is shown for converting any one of a plurality of different analog input signals.

Whenever switch element 21 (FIG. 2) is closed, switching elements 42 and 61 are also closed, so that both the output and the input of compensating amplifier 50 is grounded at that time. During periods II and IV the input voltage is removed from amplifier 10 and switch 22 is closed so that the resistor 31 input to amplifier 10 is grounded. At the same time element 41 is closed so that amplifier 50 receives the output signal of amplifier 10 (the drift voltage). It will be noted then that the input signal appearing at amplifier 50 is a square-wave signal having a peak amplitude representative of the output drift "e."

The output of circuit 60 is applied to resistor 32 in a negative sense, that is, to reduce the D.C. amplifier drift "e." The phasing of element 61 is therefore determined by the net phase change of amplifier 50, i.e., if one more phase reversing stage were added to amplifier 50, the phasing of element 61 must be reversed to provide the desired rectification to provide a negative D.C. correction signal.

From the description thus far it should now be apparent that the invention provides an effective means for compensating for the output drift component of a D.C. amplifier. Essentially the technique of the invention is to develop an A.C. signal representative of the drift component in the output signal of the D.C. amplifier at the input circuit of a compensating amplifier. This is accomplished as indicated above by referencing the input circuit of the compensating amplifier to a convenient voltage which is ground during the normal operating periods of the D.C. amplifier and then applying the output signal of the D.C. amplifier to the compensating amplifier, when its input circuit receives an input reference signal which may also be ground.

It will now be shown that the circuit provided by the invention is readily adapted for use in a system wherein a plurality of input signals are sequentially switched to the input circuit of a D.C. amplifier. Reference for this purpose is now made to FIG. 3 wherein it will be noted that switch 20 of FIG. 1 appears in the form of a plurality of switches 20*a*, 20*b* . . . 20*n* for applying respective input voltage signals $V_1$, $V_2$ . . . and $V_n$ to combining circuit 30. The leter "*n*" is used to indicate that any number of switches and input voltages may be commutated in this manner. The operation and form of circuits 10, 30, 40, 50, 60 and 70 are similar to that described above, except that synchronizing means 70 is effective to turn on switches 20 in sequence rather than to turn switch element 21 on and off successively. That is, in place of a single switching element 21 the embodiment of FIG. 3 has an effective series of switching elements 21, one for each input voltage to be applied to amplifier 10 and these elements are closed during successive periods of operation when an input signal is applied to amplifier 10. Thus in referring to FIG. 2*a* all switch functions are the same except that switch element 21 may be construed to be a different element during period III, than it is during period I.

The manner in which the invention may be employed in an analog-to-digital conversion network is also indicated in FIG. 3. In this system the output signal produced by amplifier 10 is applied to a summing network 80 including a plurality of summing resistors. An input resistor 81 receives the signal which has a negative sense with respect to the output signals of a decoder 90. Decoder 90 provides a series of digital conversions corresponding to the applied binary digits of a digital register 95. The stages of register 95 are set by a control circuit 100 which receives a signal through an amplifier 110 which indicates a difference between the signal of amplifier 10 and the sum of the signals of decoder 90.

In operation an analog signal to be converted is applied through an appropriate switch 20 and combining circuit 30 to D.C. amplifier 10. At this time compensating amplifier 50 receives a suitable reference signal such as ground. Summing network 80 then produces a difference signal amplified through amplifier 110 which indicates the analog difference between the amplitude of the analog input signal and the analog equivalent of the number in digital register 95. This difference signal then is effective through control circuit 100 to change the digital representation of register 95 until its analog equivalent is equal to the analog input signal. At this time the output signal of summing network 80 approaches ground potential since the difference between the analog input signal and the analog equivalent of register 95 is then approximately zero.

At the completion of the conversion in the above-indicated manner the number in register 95 may be shifted out for usage. During this period of operation no analog input signal is applied through any switch 20 to amplifier 10 and instead a reference signal is applied through switch 20R to combining circuit 30. At this time compensating amplifier 50 receives the output signal of amplifier 10 which corresponds to the drift "*e*."

It should be evident from this discussion that the invention is readily adapted for use in any system wherein a plurality of input signals are to be amplified through a single D.C. amplifier.

Another important feature of the invention is its adaptability to the use of electronic switches throughout. This means that the entire circuit arrangement may be mechanized through the use of similar circuits, which may be plug-in circuits and may be synchronized by the same synchronizing signals. As a typical example of a suitable electronic switch which may be employed in this manner reference is now made to FIG. 4. In this circuit the input signal is applied to a junction point 43 of a bridge circuit 44 which has an output junction point 45. Bridge circuit 44 constitutes four diodes referenced as D1, D2, D3, and D4. The diodes are arranged so that they are all forward biased by a positive signal applied to the junction of the anodes of diodes D1 and D3, and a relatively negative signal applied to the junction of the cathodes of diodes D2 and D4. If the bias signals are appropriately selected, bridge circuit 44 may then be made to operate to pass positive and negative voltage swings from input point 43 to output point 45.

The switch shown in FIG. 4 incorporates the improved features of my co-pending patent application, Serial No. 602,550 filed August 7, 1956 entitled "Bridge Gating Circuit With Floating Bias Source." This circuit will be described herein briefly, reference for further details and explanation of the theory of operation being made to the above-mentioned co-pending patent application.

A control signal from synchronizing means 70 is applied through an input diode D5 to an input transistor T1. Diode D5 is arranged so that it is forward biased by a relatively high-level input signal and then causes transistor T1 to conduct. This raises the potential developed across an emitter resistor R1 which is applied through a resistor R2 and a diode D6 to the base electrode of a second transistor T2, causing it to conduct. The conduction of transistor T2 lowers its output potential at the junction with its load resistor R3.

The signals developed across resistors R1 and R3 are applied to diodes D8 and D9, respectively, and serve to supply charging current for a storage capacitor C1. The polarity of this charge is such that capacitor C1 supplies forward-biasing voltage for bridge 44 at this time. Resistor R4 is included in series with capacitor C1 to regulate the amount and rate of current flow to the capacitor, and resistors R5 and R6 are included for coupling the capacitor biasing signal to diodes D1 and D2, respectively.

When the control signal level is relatively low, transistors T1 and T2 are cut off, lowering the potential across resistor R1 and raising the potential at the junction of resistor R3 and transistor T2. This then back biases bridge 44 since the potential applied to diodes D2 and D4 is relatively high, and that applied to diodes D1 and D3 is relatively low.

From the foregoing description it should be apparent that the invention provides an improved compensating circuit for a D.C. amplifier which is readily adapted for use in an input signal commutating system. It has been shown that electronic switches are suitable, although it will be appreciated that other types of switches may be desired such as magnetic core elements.

In the specific circuit example of FIG. 2 it was assumed that both reference potentials were ground. This need not be the case since it may be desirable to reference either the D.C. amplifier or the compensating amplifier at different potentials. For example, it would be possible to accomplish analog-to-digital conversion with a unipolarity converter by referencing the compensating amplifier at the "half-scale" point of the conversion range.

It will also be evident that many other types of filters or rectifiers are available and may be employed without departing from the spirit of the present invention. Other variations will be evident to those skilled in the art which will be encompassed by the appended claims.

I claim:

1. In a sampling circuit wherein an analog input signal is periodically applied to the input terminal of an operational amplifier to produce an output signal at an associated output terminal, a compensating circuit which utilizes the quiescent period between successive sampling periods to compensate at the input terminal of said operational amplifier for error signals appearing at the output terminal of said amplifier due to direct current drift, said compensating circuit comprising: a high gain alternating current amplifier; switching means operative during each quiescent period for applying a first reference potential to the input terminal of said operational amplifier and for simultaneously applying the output signal therefrom to said alternating current amplifier, said switching means being operative during each sampling period to apply to said alternating current amplifier a second reference potential corresponding to the quiescent output level of said operational amplifier in the absence of direct current drift; full wave rectifying means for receiving the output signal from said high gain alternating current amplifier, said rectifying means being operable in synchronism with said switching means to produce a direct current compensating signal whose amplitude and polarity are representative of the magnitude and polarity with respect to said second reference potential of the drift signal appearing at the output terminal of said operational amplifier during quiescent periods; and means for applying said compensating signal to the input terminal of said operational amplifier.

2. The combination defined in claim 1 wherein said last-named means includes a low pass filter.

3. In a sampling circuit wherein an analog input signal is periodically applied to the input terminal of an operational amplifier to produce an output signal at an associated output terminal, a compensating circuit which utilizes the quiescent period between successive sampling periods to compensate at the input terminal of said operational amplifier for error signals appearing at the output terminal of said amplifier due to direct current drift, said compensating circuit comprising: first switching means operative during each sampling period for applying the analog input signal to the input terminal of said operational amplifier and operative during each quiescent period for applying a first reference potential to said input terminal; second switching means operable in synchronism with said first switching means for sampling the output signal from said operational amplifier during quiescent periods to produce a square wave signal whose amplitude and phase are respectively representative of the magnitude and polarity of the drift error signal presented by said operational amplifier with respect to the quiescent output level of said operational amplifier in the absence of direct current drift;

a high gain alternating current compensating amplifier for amplifying said square wave signal; third switching means for receiving the amplified square wave signal from said compensating amplifier, said third switching means being operable in synchronism with said second switching means for rectifying said square wave signal to produce a direct current compensating signal whose amplitude is representative of the magnitude of the drift error signal produced by said operational amplifier and whose polarity is such as to reduce the drift error signal of said operational amplifier if applied to the input terminal thereof; and means for applying said direct current compensating signal to the input terminal of said operational amplifier.

4. The combination defined in claim 3 wherein said first switching means is operable at the sampling frequency and applies the input analog signal and said first reference potential to the input terminal of said operational amplifier for substantially equal periods of time.

5. In a commutating circuit wherein a plurality of analog input signals are periodically sampled in sequence and applied to the input terminal of an operational amplifier to produce a corresponding sequence of output signals at an associated output terminal, a compensating circuit operative during the quiescent periods between successive samplings to eliminate substantially any direct current drift produced by said operational amplifier, said compensating circuit comprising: first electronic switching means operative at the sampling frequency for applying a first reference potential to the input terminal of said operational amplifier; second switching means operable in synchronism with said first switching means for sampling the output signal of said operational amplifier during quiescent periods to produce a square wave signal whose amplitude and phase are respectively representative of the magnitude and polarity of the drift error signal presented by said operational amplifier with respect to the quiescent output level of said operational amplifier in the absence of direct current drift; a high gain alternating current compensating amplifier for amplifying said square wave signal; third switching means for receiving the amplified square wave signal from said compensating amplifier and for rectifying said square wave signal to produce a direct current compensating signal whose amplitude is representative of the magnitude of the drift error signal produced by said operational amplifier and whose polarity is such as to reduce the drift error signal of said operational amplifier if applied to the input terminal thereof; and means for applying said direct current compensating signal to the input terminal of said operational amplifier.

6. A commutating circuit for periodically sampling in sequence a plurality of input signals to produce a corresponding sequence of output signals, said circuit comprising: an operational summing amplifier having first and second input terminals and an output terminal, said amplifier being operative to produce at said output terminal an output signal representative of the weighted sum of said input signals; first sampling means for sequentially applying said input signals to said first input terminal of said operational summing amplifier, said sampling means including an electronic switch for applying a first reference potential to said first input terminal intermediate the application thereto of successive input signals; second sampling means for sampling the output signal from said amplifier when said first reference potential is applied to said first input terminal to produce a square wave signal whose amplitude and phase are representative of the magnitude and polarity of any drift error signal component present in the output signal from said amplifier; means including a high gain alternating current amplifier for amplifying said square wave signal; means operable in synchronism with said second sampling means for rectifying the amplified square wave signal produced by said alternating current amplifier to produce a direct current compensating signal representative of the magnitude and sense of said drift error signal; and means for applying said compensating signal to said second input terminal of said operational summing amplifier to thereby reduce said drift error signal.

7. In a system for converting a plurality of analog input signals into a corresponding plurality of sets of digital output signals, the system including means for translating the state of a digital register, one digit at a time, so that the decoded analog value thereof may be made to correspond to the analog input signal to be converted, and including a current summation network as part of the decoding circuit, the output current of which is zero when the analog input signal is equal to the final status of said digital register, a drift compensating arrangement operable during the non-converting time intervals to reduce the output signal drift on an input D.C. amplifier employed to apply each analog signal to said current summation network, said arrangement comprising: first means coupled to the input circuit of said D.C. amplifier for applying a reference potential thereto during the non-converting periods; a compensating amplifier; second means for applying a second reference signal to said compensating amplifier during converting periods to develop an A.C. signal at the input circuit of said compensating amplifier having an amplitude representing the output drift component of said D.C. amplifier; and means for rectifying and combining the output signal of said compensating amplifier with the input signal to be converted.

8. A drift compensated direct current amplifier circuit for amplifying an analog signal comprising:
- an operational amplifier having input and output terminals;
- a first reference potential;
- first switching means alternately applying said first reference potential and said analog signal to said operational amplifier input terminal;
- an alternating current amplifier having input and output terminals;
- a second reference potential;
- second switching means synchronized with said first switching means alternately applying said second reference potential and the potential available at said operational amplifier output terminal to said alternating current amplifier input terminal such that said second reference potential is applied to said alternating current amplifier input terminal while said analog signal is applied to said operational amplifier input terminal and the potential available at said operational amplifier output terminal is applied to said alternating current amplifier input terminal while said first reference potential is applied to said operational amplifier input terminal; and
- rectifying means connecting said alternating current amplifier output terminal to said operational amplifier input terminal.

References Cited in the file of this patent

UNITED STATES PATENTS

| | | |
|---|---|---|
| 2,685,000 | Vance | July 27, 1954 |
| 2,784,396 | Kaiser | Mar. 5, 1957 |
| 2,810,025 | Clements | Oct. 15, 1957 |
| 2,836,356 | Forrest et al. | May 27, 1958 |
| 2,846,586 | Jernahoff | Aug. 5, 1958 |
| 2,866,019 | Pedersen | Dec. 23, 1958 |
| 2,877,308 | Reiner et al. | Mar. 10, 1959 |